United States Patent
Schambacher et al.

[19]

[11] Patent Number: 6,133,775

[45] Date of Patent: Oct. 17, 2000

[54] INTEGRATED CIRCUIT WITH SWITCHED CAPACITOR

[75] Inventors: Jörge Schambacher, München; Peter Kirchlechner, Hohenthann; Jürgen Lübbe, Jacobneuharting, all of Germany

[73] Assignee: STMicroelectronics GmbH, Grasbrunn, Germany

[21] Appl. No.: 09/191,560

[22] Filed: Nov. 13, 1998

[30] Foreign Application Priority Data

Nov. 17, 1997 [DE] Germany ............... 197 50 922

[51] Int. Cl.$^7$ ...................................... G06F 7/64
[52] U.S. Cl. .................. 327/337; 327/554; 327/558; 333/173
[58] Field of Search ....................... 327/336, 337, 327/108, 116, 551–554, 557–559; 377/61; 333/173; 330/9

[56] References Cited

U.S. PATENT DOCUMENTS

| | | | |
|---|---|---|---|
| 4,344,050 | 8/1982 | Callahan | 333/173 |
| 4,468,798 | 8/1984 | Riebeek | 377/57 |
| 4,543,534 | 9/1985 | Temes et al. | 330/9 |

*Primary Examiner*—Timothy P. Callahan
*Assistant Examiner*—Minh Nguyen
*Attorney, Agent, or Firm*—Theodore E. Galanthay; E. Russell Tarleton; Seed IP Law Group PLLC

[57] ABSTRACT

A switched capacitor wherein one of the plates of the capacitor to be switched is fed with the input signal via a transistor switch receiving as control signal at the gate thereof a pulse train with predetermined frequency. For compensating the parasitic capacitance of the transistor switch, a compensation component is located between the transistor switch and the capacitor to be switched. This compensation component is formed as an incomplete transistor structure, such as only ½ of a transistor, has a drain region in common with transistor switch and has an insulated gate. The parasitic capacitance of the compensation component thus is established mainly by the capacitance between the insulated gate and the drain region and thus corresponds to the parasitic capacitance of the transistor switch, whereby complete compensation with optimized charge transfer is achieved.

14 Claims, 2 Drawing Sheets

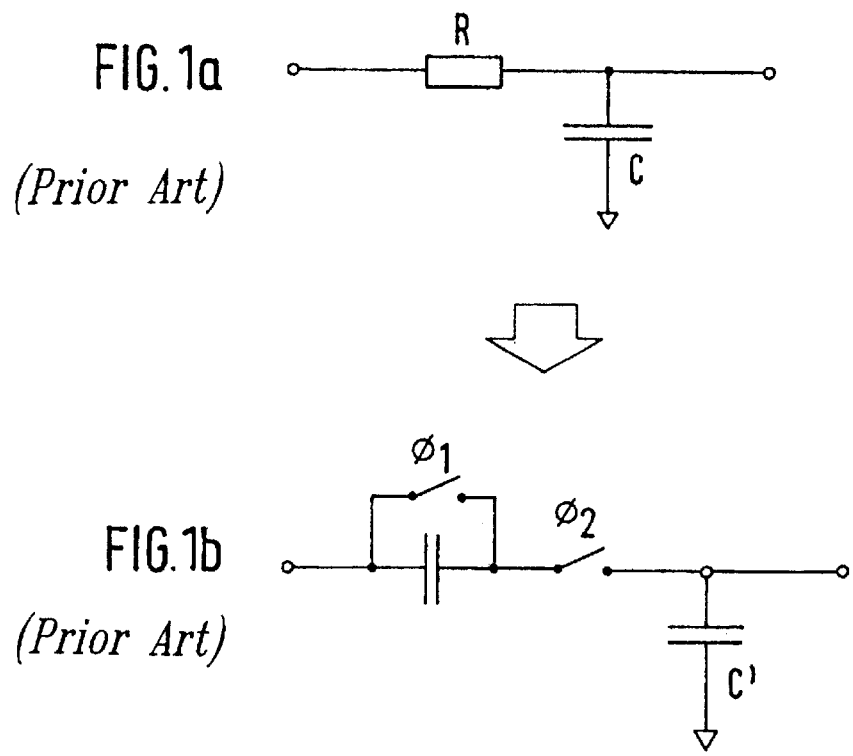
FIG. 1a (Prior Art)
FIG. 1b (Prior Art)
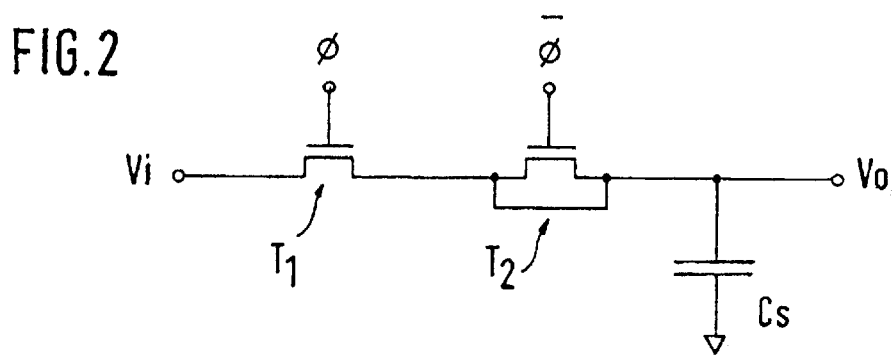
FIG. 2
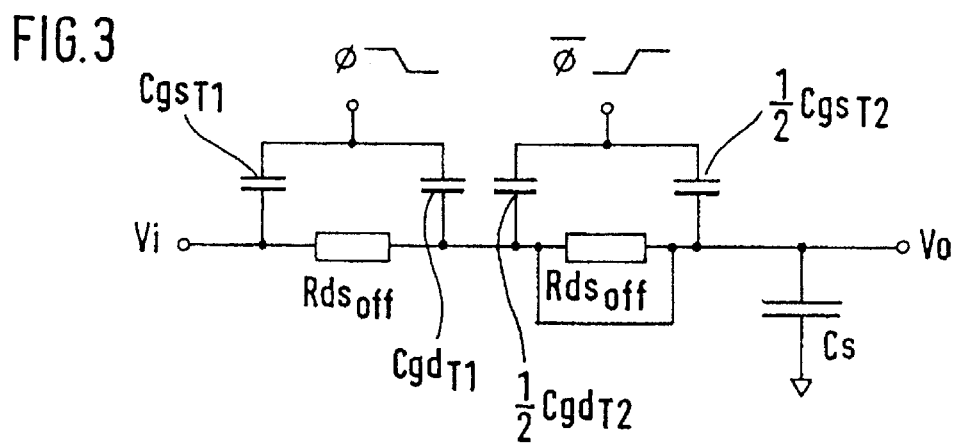
FIG. 3

INTEGRATED CIRCUIT WITH SWITCHED CAPACITOR

TECHNICAL FIELD

The invention relates to an integrated circuit having a switched capacitor and in particular to a capacitor having one of its plates coupled with a signal input via a transistor.

BACKGROUND OF THE INVENTION

It is known with respect to integrated circuits to realize certain functions with the aid of so-called switched capacitors (SCs), for example the function of an ohmic resistor. As is known, the impedance of a capacitor can be calculated from the reciprocal value of the product of frequency and capacitance. Accordingly, for simulating ohmic resistors, integrated capacitors are controlled via switches, so that a continuous reloading operation takes place at the capacitor. The frequency of the control signal is matched to the capacitance of the capacitor such that the desired impedance is obtained.

When ohmic resistors are simulated with the aid of switched capacitors, considerable chip area can be saved even in consideration of the elements required for the switching operation.

For switching the capacitor, an insulated gate field effect transistor (IGFET) is usually employed, and it is possible to make use of complementary transistors. Of course, endeavors will be made in most cases to render possible a high switching speed.

The consequence thereof in practical application is to keep the entire charge transfer as low as possible and to make the response speed to the pulse-shaped control signals as high as possible.

When for switching a transistor a standard field-effect transistor is used, for example, which is controlled with the pulse-shaped signal and which has is source drain path arranged between the signal input and a terminal or plate of the capacitor, parasitic effects play a role that is not negligible. This shall be elucidated in more detail hereinafter with reference to the accompanying FIGS. 1a and 1b and 2 of the specification.

FIG. 1a shows a typical low-pass filter having a series resistor R and a parallel capacitor C. Using switched capacitors, this circuit can be designed without the ohmic resistor R, as shown in FIG. 1b. Resistor R has been replaced by a capacitor and a switch disposed in parallel thereto, which can be shorted in an intermittent manner by a signal $\phi_1$ and which has a further switch connected in series therewith that is periodically coupled to the downstream capacitor C' by a second, not overlapping signal $\phi_2$.

FIG. 2 depicts a circuit arranged between an input terminal receiving a signal Vi and an output terminal delivering an output signal Vo. The upper plate of switched capacitor Cs is connected to the input via two transistor switches T1 and T2. The two transistor switches are each formed as IGFET and are fed at the gate thereof with signal $\phi$ and $\bar{\phi}$, respectively. The source-drain path of T1 is arranged between the input and the upper plate of Cs, the same holding also for transistor switch T2, however, with a short-circuit connection being present here between source and drain.

FIG. 3 shows the equivalent circuit diagram of the arrangement depicted in FIG. 2. First, the transistor switch depicted to the left in FIG. 2 and FIG. 3 shall be explained. The equivalent circuit diagram contains ohmic resistor $Rds_{off}$, which is the ohmic resistor in the channel between source and drain when the transistor is switched off.

Between the insulated gate and the source as well as between the insulated gate and drain, there is a (parasitic) capacitance $Cgs_{T1}$ and $Cgd_{T1}$, respectively.

FIG. 4 shows, in greatly exaggerated manner, the path of the rear edge of signal $\phi$ and the front edge of signal $\bar{\phi}$, respectively. Within a period of time $\Delta t$, the voltage of $\phi$ decreases and the voltage of $\bar{\phi}$ increases, respectively, by $\Delta V$.

Without transistor switch T2, the capacitance $Cgd_{T1}$ thus acts on the capacitor Cs to be switched. Thus, solely by the parasitic capacitance of the transistor switch T1, a load having an influence on Cs and thus requiring consideration, results in accordance with the following equation:

$$\Delta Q = Cgs \cdot \Delta v \qquad (1)$$

In the usual design of field effect transistors in integrated circuits, it can be assumed here for reasons of simplification $$Cgs = Cgd \qquad (2)$$

Consequently, this means that the parasitic capacitances of the insulated gate are of equal value with respect to source and with respect to drain.

The parasitic capacitance introduced by the transistor switch has to be taken into consideration in the design of the circuit and the operation thereof, since the value $\Delta Q$ according to above equation (1) constitutes a charge amount that has to be transported in addition to the charge stored in capacitor Cs. An erroneous overall charge transfer leads to erroneous operation of the circuit in total.

The effects of the parasitic capacitance between the gate and the drain of T1 can be eliminated with the aid of the second transistor switch T2 in FIG. 2.

As shown in the equivalent circuit diagram in FIG. 3, second transistor switch T2 also has a series resistor and two parallel capacitors each set such that their capacitance is half of the parasitic capacitance between the insulated gate and the drain of T1, for example. As will still be explained hereinafter, the parasitic capacitance $Cgd_{T1}$ is compensated by the two parasitic capacitances of transistor switch T2 when the parasitic capacitances thereof are each half as large as the one parasitic capacitance of T1. This is indicated in FIG. 3 on the right-hand side by the designations ½ ($Cgd_{T2}$) and ½ ($Cgs_{T2}$), respectively. On the condition that $Cgd_{T2}$=½ ($Cgs_{T1}$), the desired value $$\Delta Q = 0$$

then is obtained as compensated charge $\Delta Q$ from $$\Delta Q = (2 \cdot Cgd_{T2} - Cgs_{T1}) \Delta v \qquad (3)$$

With the arrangement shown in FIG. 3, i.e., a switched capacitor $C_s$, a transistor switch T1 arranged between one plate of the switched capacitor and the input, and a compensation component (compensation transistor) T2 connected in series therewith, an arrangement is created in which undesired parasitic effects of the transistor switch T1 can be compensated.

When the transistor switch T1 is formed on as little chip area as possible, the overall chip area of the transistor switches required for numerous switched capacitors can be minimized. The smallest dimensions for individual structures of the integrated transistor switch are predetermined by several effects, for example the specific manufacturing process for making the IC chip. When looking at the equivalent circuit diagram of FIG. 3, one can see that the transistor switch T1 itself can be realized with the smallest possible structures; for achieving the effect that the two parasitic capacitors of switch T2 in FIG. 3 have half the capacitance of one of the two parasitic capacitors of transistor switch T1 each, it is possible at the most to minimize the structures of component T2, but not those of transistor switch T1. The structures of transistor switch T1 in general have to be twice as large as those of component T2.

Thus, in designing the circuit it is necessary first to determine the structure for component T2, and on the basis of this the construction of T1 is determined, with the dimensions of the latter, in particular the channel length (cp. length 1 min in FIG. 5) between source and drain, being twice as large as in component T2.

These marginal conditions are not only undesirable for the reason that relatively much chip area is necessary for the switches of the switched capacitor. Since the conditions are such as elucidated by way of FIG. 3, the parasitic capacitances of transistor switch T1 in addition are relatively large, and the charge amount to be transferred is correspondingly large.

SUMMARY OF THE INVENTION

It is the object of the invention to provide an integrated circuit comprising at least one switched capacitor, which requires only relatively little chip area while there is provided the associated compensation component for each switched transistor.

This object is met according to the invention in that the compensation component is constituted by an incomplete transistor structure having a gate adjoining a drain region or a source region of the transistor switch to which said one plate of the switched capacitor is connected.

The invention in principle relies on use of what may generally be considered a half-transistor (½-transistor). This ½-transistor, for example, contains a drain formed in common with the drain of the transistor switch, and it contains an insulated gate corresponding to half the channel length between the drain and the source of the transistor switch. This arrangement provides a parasitic capacitance between the insulated gate of the compensation component (of the ½-transistor) and the drain which corresponds to the entire parasitic capacitance of the compensation component and thus is only one half of that of a compensation component consisting of a complete transistor. The size of the gate corresponds to half of the size of the gate of the transistor switch. This achieves aim of the compensation, namely the possibility of minimizing the structure of the transistor switch while nevertheless fully compensating the entire parasitic capacitance thereof that is effective for the capacitor to be switched.

The invention is useful with a transistor switch having a source, a drain and a gate, the gate thereof being fed with a control signal in the form of a pulse train of predetermined frequency, with a compensation component being located between the transistor switch and a capacitor plate, which is controlled in phase-opposition to the transistor switch so as to compensate the influence of the effective parasitic capacitance of the transistor switch.

One embodiment of the invention provides that the transistor switch comprises two complementary FET transistors, with the gates thereof, just as the gates of two complementary compensation components, being fed with control signals of opposite phase.

When assuming a minimum parasitic capacitance of the compensation component, designated $Cg_{min}$, the following relationship results from above equation (3) for the component according to the invention:

$$\Delta Q = (Cgd_{T2} - Cgd_{T1}) \cdot \Delta v = (Cgd_{min} - Cgd_{min}) \cdot \Delta v 32\ 0 \quad (4)$$

BRIEF DESCRIPTION OF THE DRAWINGS

In the following, embodiments of the invention will be elucidated in more detail by way of the drawings in which FIGS. 1a and 1b shows an RC member and the embodiment thereof simulated with the aid of a switched capacitor;

FIG. 2 shows a switched capacitor comprising a transistor switch and a compensation switch;

FIG. 3 shows the equivalent circuit diagram of the circuit according to FIG. 2;

DETAILED DESCRIPTION OF THE INVENTION

Figure 4:
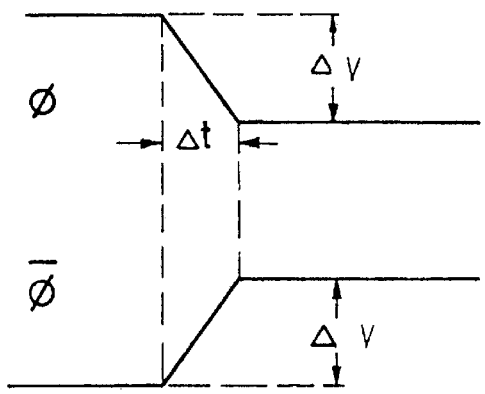
FIG. 4 shows the path of pulse edges of the control signal for the transistor switches in FIGS. 2 and 3.
Figure 5:
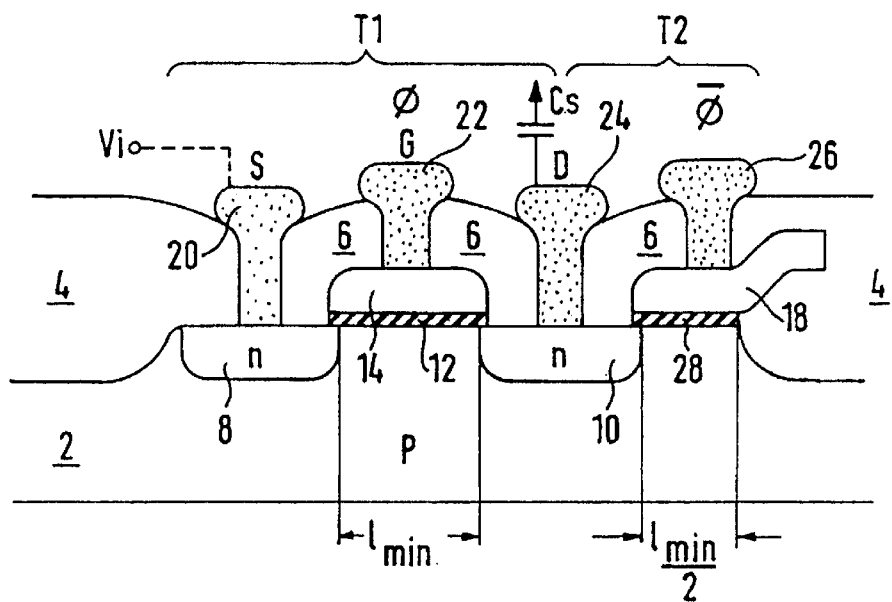
FIG. 5 shows a sectional view of an integrated circuit according to the invention.
Figure 6:
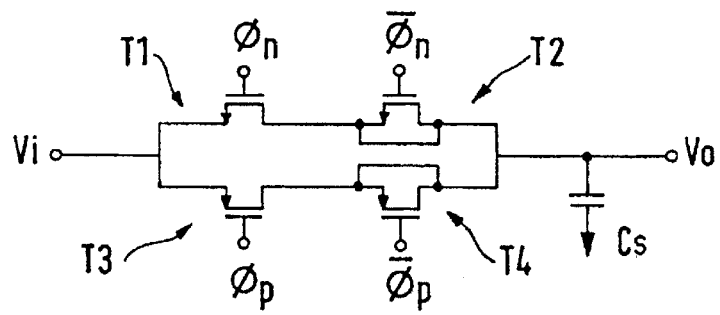
FIG. 6 shows a modified embodiment of the circuit of the invention in the form of a basic diagram.

Before discussing one embodiment of the invention having the layout shown in FIG. 5, one embodiment of a modification of the circuit of the invention according to FIG. 6 shall be discussed.

The circuit according to FIG. 6 differs from the circuit according to FIG. 2 in that the switch arrangement is formed by a parallel connection of two series connections each comprising two switches T1, T2 and T3, T4, respectively. Switches T1 and T3 are formed by a first pair of complementary transistors and switches T2 and T4 are formed by a second pair of complementary transistors the source and drain electrodes of each of which are short-circuited. While switches T1 and T2 receive the signals $\phi_n$ and $\overline{\phi}_n$ (for the n-channel transistors), respectively, the gates of the switches T3 and T4 located in the parallel signal path are fed with the signal $\phi_p$ and $\overline{\phi}_p$ (corresponding to the p-channel transistors) respectively. The signals $\phi_n$ and $\overline{\phi}_n$ as well as the signals and $\phi_n$ and $\phi_p$, respectively differ from each other in that they are of opposite polarity or phase. It is possible to use $\phi_n = \overline{\phi}_p$ and $\phi_p = \overline{\phi}_n$. One can see that the circuit shown in FIG. 6 permits a more rapid charge transfer than the circuit according to FIG. 2; the reason therefor is that the complementary transistors achieve good, uniform conductivity across the entire input voltage range.

FIG. 5 shows a sectional view of an integrated circuit making use of the principle according to the invention.

The switch transistor T1 according to FIG. 2 and the compensation component T2 are formed on a p-type substrate 2 between field oxide portions 4. The process steps for obtaining the structure shown in FIG. 5 need not be shown here any more. As is apparent to those of skill in this art, it is possible to use known photolithographic processes to obtain this structure, as they are commonly used in the semiconductor industry.

In the region between the field oxide 4, there are formed two n-type regions 8 and 10. The channel of transistor T1 is located between them. A gate electrode 14 is disposed above an insulating layer 12 between the two n-type regions 8 and 10.

The n-type region 8 has a source contact 20 in connection with the input of the circuit receiving the signal Vi. Gate electrode 14 is provided with a gate contact 22 to which control signal φ is fed. The n-type region 10 is the drain region and is in contact with a drain terminal 24 which is electrically connected to the plate of switched capacitor Cs as shown in FIG. 2, the details of the electrical connection need not be shown since such is well known.

In accordance with the structure shown to the right in FIG. 5 and differently from the assumption that may otherwise be suggested on the basis of the symbolic representation of component T2 in FIG. 2, it is not a complete transistor, but only half of a transistor (½-transistor) is present. The latter contains as drain region the n-type region 10 in common with transistor T1. Between the field oxide 4 shown on the right side in FIG. 5 and the n-type region 10, the surface of the p-type substrate is provided with a gate insulation layer 28, and on top of the latter there is provided a gate electrode 18 which receives the control signal $\bar{\phi}$ via a gate terminal 26.

The gate insulator 18 and gate electrode 28 for T2 are approximately one-half (½) the width of transistor T1, insulator 12 and gate electrode 14, so that the channel width of T2 is about one-half the channel width of T1. In an alternative embodiment, the sizes are selected so the channel of T2 is 60% of the area of the channel of T1. Further, the transistor T2 has, in effect, no drain region. Instead, it has only a source region 10 which is common with the drain region 10 of T1. Transistor T2 is thus a partial transistor, alternatively referred to as an incomplete transistor. The structure of T2 may also appropriately be called a clocked capacitor in that, as shown in FIG. 7, it has the structure of a capacitor having one place clocked at a selected frequency.

One can thus see in FIG. 5 that for compensating the parasitic capacitance between the gate 14 and the drain, i.e., the n-type region of transistor T1, no complete transistor, but only half of a transistor is used which has a certain capacitance between its gate 18 and the drain region 10 for compensating the parasitic capacitance Cgd of transistor T1.

It can be seen from FIG. 5 that the "channel" between the n-type region 10 and the adjacent field oxide 4 can be formed with a very small length $1_{min}/2$, with the channel length of the transistor T1 being then twice as large, namely $1_{min}$. In comparison with the solution with two complete transistor switches, as shown in FIG. 2, the circuit according to FIG. 5 and the equivalent circuit according to FIG. 7 thus save chip area and have other advantages.

Figure 7:
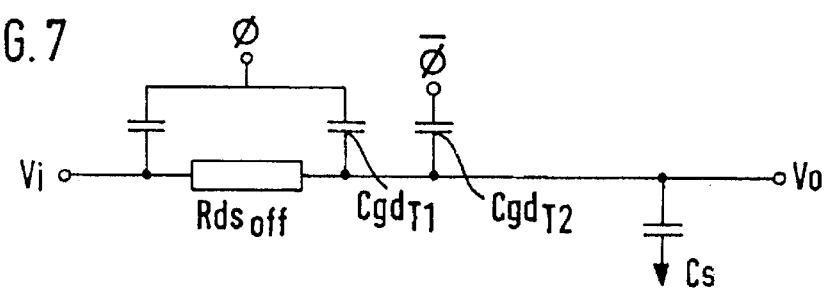
FIG. 7 shows an equivalent circuit diagram of the structure shown in FIG. 5 (with the switched capacitor not shown in FIG. 5).

FIG. 7 shows the equivalent circuit diagram of the arrangement shown in FIG. 5. The ohmic resistor $Rds_{off}$ of compensation transistor T2 in FIG. 2 is instead the equivalent of plain capacitor $Cgd_{T2}$.

One of skill in the art can see that the equivalent circuit shown in FIG. 7 can easily be modified so as to obtain the complementary circuit arrangement shown in FIG. 6.

The structure of an effective ½ of a transistor can also be used in other situations where reduced capacitance of the transistor is desired.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit comprising:
   a switched capacitor for simulating an ohmic resistor and having one of its plates coupled with a signal input via a transistor switch having a source, a drain and a gate, the gate thereof being fed with a control signal in the form of a pulse train of predetermined frequency, with a compensation component being located between the transistor switch and one capacitor plate of said switched capacitor, which is controlled in phase opposition to the transistor switch so as to compensate the effective parasitic capacitance between the gate and the drain or between the gate and the source of the transistor switch, wherein the compensation component being composed of an incomplete transistor structure having a gate adjoining a drain region or a source region of the transistor switch to which said one plate of the switched capacitor is connected.

2. The integrated circuit of claim 1, wherein the transistor switch is formed as an insulated gate field effect transistor, and the compensation component also comprises an insulated gate.

3. The integrated circuit of claim 1, wherein the length of the gate of the compensation component is about half as large as the length of the gate of the transistor switch.

4. The integrated circuit of claim 1, wherein the transistor switch comprises two complementary FET transistors, the gates thereof, just as the gates of two complementary compensation components, being fed with control signals of opposite phase.

5. An integrated circuit comprising:
   a signal input;
   a switched capacitor having a first terminal and a second terminal;
   a transistor switch having a source region, a drain region, a gate and a parasitic capacitance effective between the gate and the drain region or between the gate and the source region of the transistor switch;
   a compensation component constituted by a partial transistor structure;
   the first terminal of the switched capacitor being coupled with the signal input via the transistor switch;
   the gate of the transistor switch being fed with a switching control signal in the form of a pulse train of predetermined frequency;
   the compensation component being located between the transistor switch and the first terminal of the switched capacitor;
   the compensation component being controlled in phase opposition to the transistor switch so as to compensate the parasitic capacitance of the transistor switch; and
   the compensation component having a gate adjoining the drain region or the source region of the transistor switch to which the first terminal of the switched capacitor is connected.

6. The integrated circuit of claim 5, wherein the transistor switch comprises an insulated gate field effect transistor, and the compensation component comprises an insulated gate.

7. The integrated circuit of claim 5, wherein the length of the gate of the compensation component is about half as large as the length of the gate of the transistor switch.

8. The integrated circuit of claim 5 comprising a parallel connection of two series connections, each series connection comprising a transistor switch and a compensation component;
   wherein the two transistor switches are complementary transistors the gates of which are fed with control signals of opposite phases; and
   the two compensation components are complementary incomplete transistor structures the gates of which are fed with the control signals of opposite phases.

9. An integrated circuit comprising:

a switched capacitor for simulating an ohmic resistor and having one of its plates coupled with a signal input via a transistor switch comprising first and second complementary FET transistors, each having a source, a drain and a gate, the gates thereof being fed with control signals of an opposite phase in the form of a pulse train of predetermined frequency, with a compensation component being located between the transistor switch and one capacitor plate of the switched capacitor, which is controlled in phase opposition to the transistor switch so as to compensate the effective parasitic capacitance between the gate and the drain or between the gate and the source of the transistor switch, wherein the compensation component being composed of first and second incomplete transistor structures each having a gate adjoining a drain region or a source region of the first and second complementary FET transistors to which said one plate of the switched capacitor is connected.

10. The integrated circuit of claim 9, wherein the transistor switch is formed as an insulated gate field effect transistor, and the compensation component also comprises an insulated gate.

11. The integrated circuit of claim 9, wherein the length of the gate of the compensation component is about half as large as the length of the gate of the transistor switch.

12. An integrated circuit comprising:

a signal input;

a switched capacitor having a first terminal and a second terminal;

a transistor switch having a source region, a drain region, a gate and a parasitic capacitance effective between the gate and the drain region or between the gate and the source region of the transistor switch;

a compensation component constituted by a partial transistor structure;

the first terminal of the switched capacitor being coupled with the signal input via the transistor switch;

the gate of the transistor switch being fed with a switching control signal in the form of a pulse train of predetermined frequency;

the compensation component being located between the transistor switch and the first terminal of the switched capacitor;

the compensation component being controlled in phase opposition to the transistor switch so as to compensate the parasitic capacitance of the transistor switch;

the compensation component having a gate adjoining the drain region or the source region of the transistor switch to which the first terminal of the switched capacitor is connected; and a parallel connection of two series connections, each series connection comprising a transistor switch and a compensation component;

wherein the two transistor switches are complementary transistors the gates of which are fed with control signals of opposite phases; and the two compensation components are complementary incomplete transistor structures the gates of which are fed with the control signals of opposite phases.

13. The integrated circuit of claim 12, wherein the transistor switch comprises an insulated gate field effect transistor, and the compensation component comprises an insulated gate.

14. The integrated circuit of claim 12, wherein the length of the gate of the compensation component is about half as large as the length of the gate of the transistor switch.

* * * * *